United States Patent
Kwon et al.

[11] Patent Number: 5,858,590
[45] Date of Patent: Jan. 12, 1999

[54] METHOD FOR FORMING PHOTORESIST PATTERNS

[75] Inventors: O Sung Kwon; Doo Hee Lee; Hyung Sun Yook; Heung Gee Hong; Young Mo Goo, all of Ichonkun, Rep. of Korea

[73] Assignee: Hyundai Electronics Industries Co., Ltd., Kyoungkido, Rep. of Korea

[21] Appl. No.: 959,961

[22] Filed: Oct. 24, 1997

Related U.S. Application Data

[63] Continuation of Ser. No. 344,898, Nov. 25, 1994, abandoned.

[30] Foreign Application Priority Data

Nov. 25, 1993 [KR] Rep. of Korea .................. 1993-25304

[51] Int. Cl.$^6$ ............................................. G03C 5/00
[52] U.S. Cl. ............................................. 430/30; 430/270.1
[58] Field of Search ................................. 430/270.1, 30

[56] References Cited

U.S. PATENT DOCUMENTS 5,427,878  6/1995  Corliss ............................ 430/30
5,437,948  8/1995  Minghetti et al. .................. 430/30

Primary Examiner—John S. Chu
Attorney, Agent, or Firm—Merchant, Gould, Smith, Edell, Welter & Schmidt

[57] ABSTRACT

A method for forming photoresist patterns by performing a photolithograpy process by the unit of a predetermined number of wafers, wherein the photoresist patterns are formed under a condition that an exposure time taken to fore each of the photoresist patterns is predetermined taking into consideration a variation in reflection factor, on the basis of the following equation:

$$Z=X+\{(r-a)\times(Y-X)/(\beta-\alpha)\}$$

where, "T" represents a reference thickness corresponding to a thickness of a photoresist film to be patterned to form a corresponding one of the photoresist patterns, exhibiting a minimum reference factor or a maximum reference factor, "T'" a thickness limit more than the reference thickness (T), "$\alpha$" a reference reflection factor at the reference thickness (T), "$\beta$" a reflection factor limit at the thickness limit (T'), "r" a varied reflection factor, "X" a reference exposure time at the reference reflection factor ($\alpha$), "Y" an exposure time limit at the reflection factor limit ($\beta$), and "Z" the varied exposure time.

2 Claims, 3 Drawing Sheets

METHOD FOR FORMING PHOTORESIST PATTERNS

This is a File Wrapper Continuation of application Ser. No. 08/344,898, filed Nov. 25, 1994, now abandoned.

BACKGROUND OF THE INVENTION

1. Field of the Invention

The present invention relates to a method for forming photoresist patterns in fabrication of semiconductor devices, and more particularly to such a photoresist pattern forming method capable of improving a critical dimension uniformity by predetermining an exposure time depending on a variation in a reflection factor generated during an exposure of a photoresist film.

2. Description of the Prior Art

As a conventional technique for predetermining an exposure time for forming a photoresist pattern, there has been known a method involving, in formation of patterns with a critical dimension by the unit of a lot (including 24 wafer sheets or 48 wafer sheets), preparing a photo latitude curve as shown in FIG. 1 on the basis of one wafer optionally selected from each lot, deriving an exposure time by use of the photo latitude curve, and applying the exposure time to all wafers of the lot.

In accordance with this method, however, patterns may be non-uniformly formed due to a coating thickness difference between lots or between wafers or a variation in a reflection condition of a substrate. As a result, a non-uniformity problem may occur.

SUMMARY OF THE INVENTION

Therefore, an object of the invention is to solve the above-mentioned problem encountered in the prior art and, thus, to provide a method for forming photoresist patterns, capable of predetermining an exposure tine of a photoresist file depending on a reflection factor and thereby reducing the critical dimension difference between wafers or between lots, thereby improving a critical dimension uniformity.

In accordance with the present invention, this object can be accomplished by providing a method for forming photoresist patterns by performing a photolithography process by the unit of a predetermined number of wafers, wherein the photoresist patterns are formed under a condition that an exposure time taken to form each of the photoresist patterns is varied depending on a variation in reflection factor.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
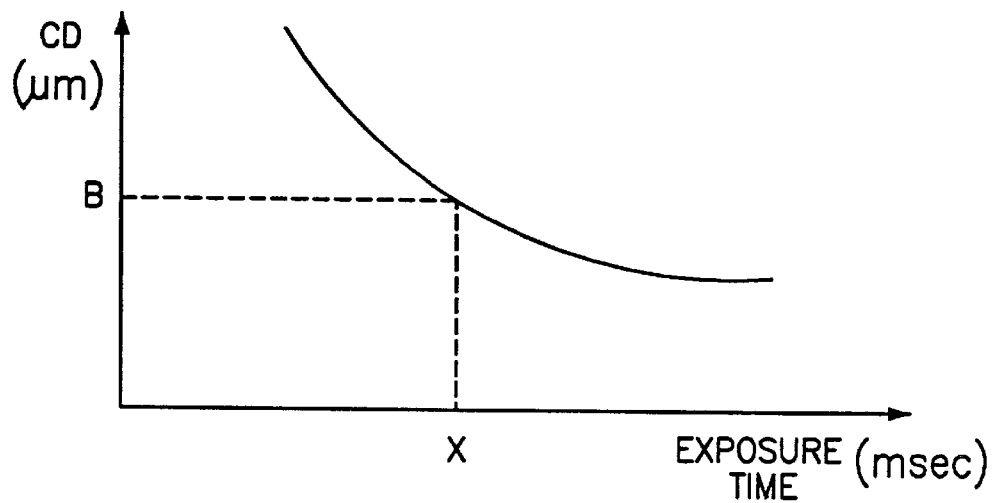
FIG. 1 is a photo latitude curve used to predetermine an exposure time for a pattern formation in accordance with the prior art.
Figure 2:
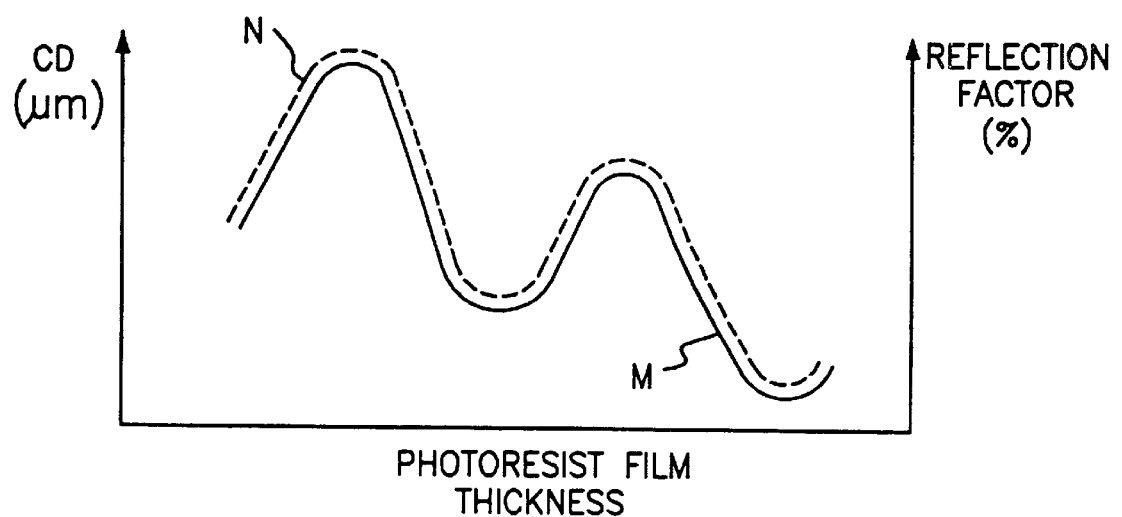
FIG. 2 is a curve depicting a variation in critical dimension and a variation in reflection factor depending on a variation in photoresist film thickness.

The present invention utilizes the principle that a variation in critical dimension depending on a variation in photoresist film thickness is proportional to a variation in reflection factor depending on the variation in photoresist file thickness, as indicated by curves M and N in FIG. 2. The curve M is indicative of the variation in critical dimension while the curve N is indicative of the variation in reflection factor. In other words, the present invention is a technique for exposing a photoresist film for an exposure time calculated on the basis of a reflection factor measured by the unit of a lot or a wafer in accordance with the principle. Since the reflection factor includes information about a variation in thickness of the photoresist film and a variation in reflection condition of a substrate, and other information, a predetermination of a critical dimension based on the reflection factor makes it possible to obtain an accurate result.

Now, a method for predetermining the relation of the exposure time with the reflection factor in accordance with the present invention will be described.

Figure 3A:
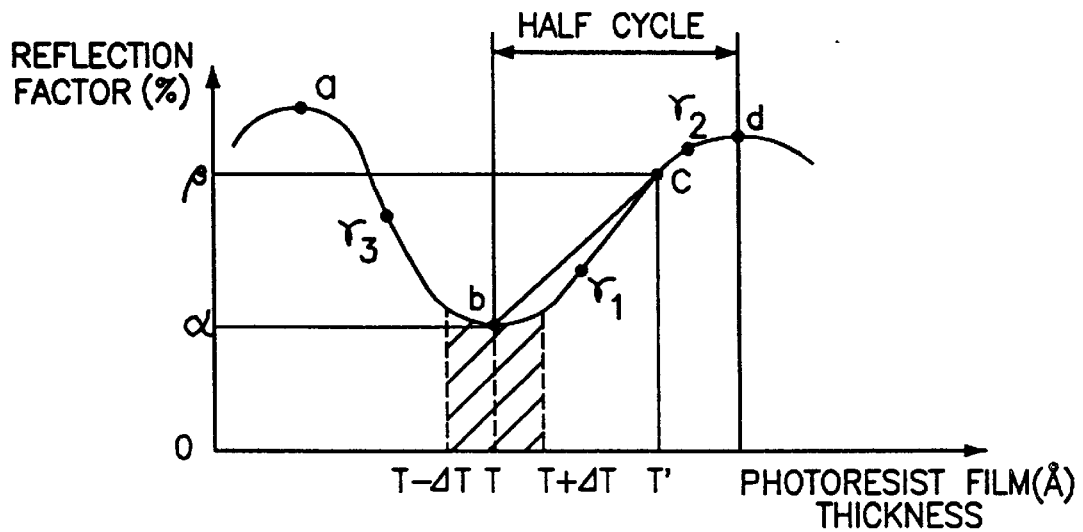
FIGS. 3A and 3B are graphs for predetermining a reference reflection factor and a reflection factor limit depending on the photoresist film thickness in accordance with the present invention, respectively.
Figure 3B:
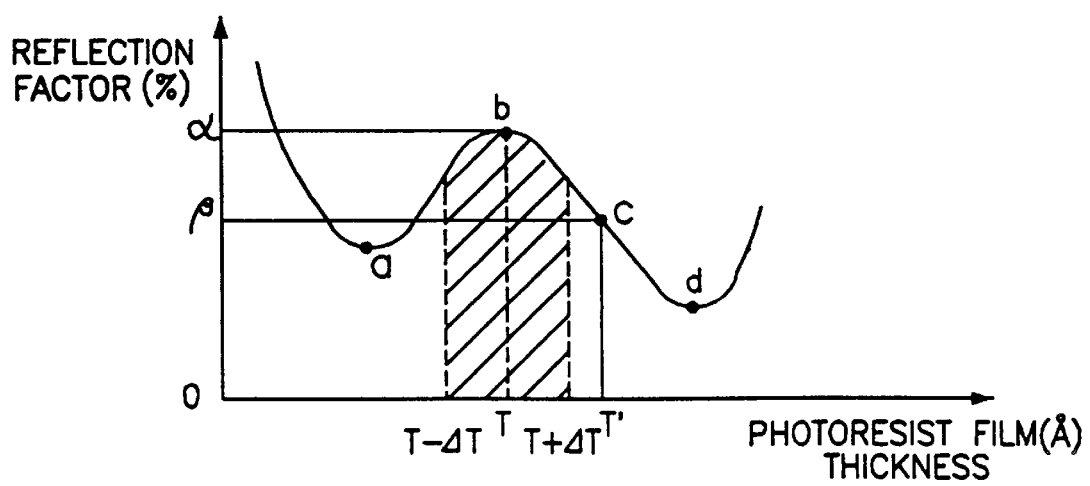

In accordance with the method, first, a reference thickness T and a thickness limit T' are predetermined As shown in FIG. 3A, the reference thickness T is determined by a thickness of photoresist film exhibiting the minimum reflection factor On the other hand, the thickness limit T' is determined by a thickness of photoresist film larger than a thickness control limit ensuring a process tolerance $\Delta T$ within a half of one cycle. Although the reference thickness T is determined by the thickness of photoresist film exhibiting the minimum reflection factor in the case of FIG. 3A, it may be determined by a thickness of photoresist film exhibiting the maximum reflection factor, as shown in FIG. 3B.

Figure 4:
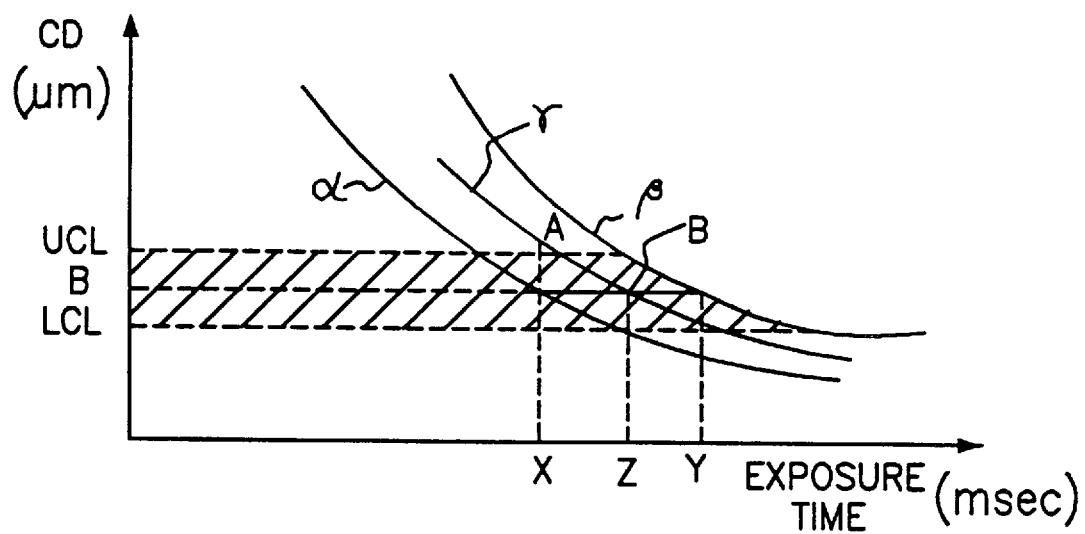
FIG. 4 is a diagram illustrating photo latitude curves in accordance with the present invention.

Thereafter, reflection factors $\alpha$ and $\beta$ of two photoresist films respectively having thicknesses of T and T' are measured. Based on the measured reflection factors $\alpha$ and $\beta$, photo latitude curves are prepared, respectively, as shown in FIG. 4. Using the prepared photo latitude curves, an exposure time depending on a reflection factor can be determined. For example, an exposure time for obtaining a critical dimension of B is X msec. at the reflection factor of $\alpha$ and Y msec. at the reflection factor of $\beta$. In FIG. 4, "UCL" and "LCL" represent the upper control limit and the lower control limit, respectively.

Where an exposure of a photoresist film is carried out in accordance with the conventional method wherein an exposure time is determined irrespective of a variation in reflection factor caused during the exposure, a critical dimension obtained after the exposure may be beyond a control limit range when the reflection factor has varied. For example, where a target critical dimension is to be obtained at the reflection factor of $\alpha$, an exposure of a photoresist film having a thickness of T is carried out for X msec. If the reflection factor varies from $\alpha$ to y during the exposure, a critical dimension A is obtained which is beyond the upper control limit, as shown in FIG. 4. In this case, the target critical dimension B can be obtained when the exposure time is varied to Z msec. The variation in reflection factor may be caused by a variation in reflection condition in a substrate even when the thickness of the photoresist film is constant or when a variation in thickness of the photoresist film is constant. The variation in reflection factor exhibits an equivalent effect to that resulted from the variation in thickness of the photoresist file.

The exposure time of Z msec. newly determined depending on the variation in reflection factor is in a range defined between the reference exposure time X and the exposure time limit Y in the photo latitude curves of FIG. 4, in accordance with the relation that the critical dimension is proportional to the reflection factor. The new exposure time Z is calculated by multiplying the exposure time difference (Y–X) between the reference exposure time X and the exposure time limit Y by the difference (Y–α) between the reference reflection factor α and the measured reflection factor Y varied from the reference reflection factor α, dividing a value resulted from the multiplication by the difference (β–α) between the reference reflection factor α and the reflection factor limit β, and then adding the lower exposure time control limit X to a value resulted from the division. This can be expressed by the following equation:

$$Z = X + \{(y-\alpha) \times (Y-X)/(\beta-\alpha)\} \, msec.$$

Where the exposure process is carried out by the unit of a lot, the reflection rate Y is measured from a first wafer. Based on the measured reflection rate, all wafers are is subjected to exposure for the same exposure time Z. In this case, the critical dimension difference among lots is very small. Accordingly, it is unnecessary to predetermine an exposure condition for every lot. As a result, it is possible to achieve a uniform adjustment for critical dimension and yet reduce the interval of measuring the critical dimension. Where the measurement of the reflection factor is carried out during the standby time of a stepper equipment, there is no additional time caused by the measure of the reflection factor. It is also possible to reduce a bottle neck phenomenon occurring at a scanning electronic microscope used for the critical dimension measurement.

Where the minimum reflection factor is used as the reference reflection factor α, as in the case of FIG. 3A, the measured reflection factor Y must not be less than the reference reflection factor α. In the case of FIG. 3A, the reflection factor Y may be positioned at an optional point on the reflection factor curve and, for example, may be $Y_1$, $Y_2$ or $Y_3$. Even when the reflection factor r is positioned at any point on the reflection factor curve, it can be compensated based on the gradient between points b and c respectively predetermined on the basis of the reference thickness T and the thickness limit T'. In other words, the compensation is achieved by multiplying a unit variation in exposure time depending on a variation in reflection factor ((Y–X)/(β–α)) by a measured reflection factor variation (Y–α) (Y=$r_1$, $r_2$ or $Y_3$).

Even when the exposure time limit Y is positioned beyond the range defined between points a and d in FIG. 3A, it is handled in equivalent manner to those in the range. Accordingly, the compensation can be applied to all points on the reflection factor curve. In this case, the only important factor is to predetermine the thickness limit T'. Since the practical compensation range is the shaded area in FIG. 4, a more accurate compensation can be obtained when the thickness limit T' is more approximate to the value T+ΔT or the value T–ΔT. The thickness limit T' should be predetermined not to be beyond the range between the points a and d. Where the thickness limit T is determined to be beyond the range between the points a and d, an erroneous gradient is calculated.

Assuming that the reference exposure time X for the thickness T and the exposure time limit Y for the thickness T' are 200 msec and 300 msec., respectively, under a condition of α=30% and β=50%, the unit exposure time variation per the reflection factor variation of 1% is 5 msec on the basis of the calculation of (300–200)/(50–30). If a measured reflection factor is 37% in this case, a new exposure time under a condition of the coated thickness of T is 235 msec. obtained by multiplying the unit exposure time variation of 5 msec by the exposure time variation of 7% (r–α=37–30 =7(%)) and then adding a value (5×7=35 (msec.)) resulted from the multiplication to the reference exposure time X (X=200 msec.). This result is on the basis of critical dimension bar.

Where an increase in reflection rate is generated during an exposure of a photoresist film, an increase in critical dimension is expected, as shown in FIG. 2. If the exposure is continued without varying the exposure time previously predetermined, the obtained critical dimension may be beyond the critical dimension limit range. In order to avoid such a phenomenon, the exposure time should be increased by an appropriate value which can be calculated in accordance with the above-mentioned method.

As mentioned above in conjunction with FIG. 3B, the reference thickness T may be determined by a thickness exhibiting the maximum reflection factor. In this case, the exposure time limit Y is less than the reference exposure time X. In other words, the exposure time Z should be reduced when a variation in reflection factor occurs because the measured reflection factor Y varied from the reference reflection factor α is less than the reference reflection factor α. Since the value (Y–X)/(β–α) is a positive value while the value (Y–α) is a negative value, the adjusted exposure time Z is less than the reference exposure time X. In this case, accordingly, the equation for calculating the exposure time Z can be applied as in the case using the thickness exhibiting the minimum reflection factor as the reference thickness. For the application of the equation, however, only a change between α and β in the graph of FIG. 4 is required.

As apparent from the above description, the present invention provides the following effects:

First, a uniform critical dimension can be obtained because a variation in reflection condition caused by a variation in condition of a substrate, a cleaning treatment and a pre-treatment prior to coating of a photoresist film is compensated on the basis of a variation in reflection factor so that an exposure of the photoresist film is carried out under the compensated condition; and Second, a decrease in the number of process steps and an improvement in productivity can be obtained because the number of measurement times for the critical dimension is reduced by virtue of the uniform critical dimension.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method of determining an exposure time of a coated photoresist film formed on a plurality of wafers treated by the same manufacturing processes, comprising the steps of:

evaluating a reference reflection factor at a reference thickness of the coated photoresist film in a first region of only one of the wafers, wherein a thickness of the coated photoresist film is the most thinnest or thickest photoresist film;

evaluating a reflection factor limit at a thickness limit of the coated photoresist film in a second region of the wafer, wherein the thickness in the second region is different from that in the first region and wherein such a thickness difference is caused by a maximum processing margin in a photoresist coating process;

measuring a real reflection factor of the photoresist on the wafer wherein the real reflection factor is between the reference reflection factor and the reflection factor limit;

calculating an exposure time corresponding to the real reflection factor using the following relationship:

$$Z = X + \{(\gamma-\alpha) \times (Y-X)/(\beta-\alpha)\}$$

where, $\alpha$: a reference reflection factor at a reference thickness (T);

$\beta$: a reflection factor limit at a thickness limit (T');

$\gamma$: a measured reflection factor;

X: a reference exposure time at the reference reflection factor ($\alpha$);

Y: an exposure time limit at the reflection factor limit ($\beta$); and

Z: the calculated exposure time; applying the calculated exposure time to all the wafers.

2. A method in accordance with claim 1, wherein the thickness limit (T') is greater than a thickness value obtained by adding a process tolerance ($\Delta T$) to the reference thickness (T).

* * * * *